(12) United States Patent  
Hsu

(10) Patent No.: US 8,023,019 B2
(45) Date of Patent: Sep. 20, 2011

(54) IMAGE-SENSING CHIP PACKAGE MODULE FOR REDUCING ITS WHOLE THICKNESS

(75) Inventor: Chi-Hsing Hsu, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 502 days.

(21) Appl. No.: 12/222,093

(22) Filed: Aug. 1, 2008

(65) Prior Publication Data
US 2009/0273698 A1 Nov. 5, 2009

(30) Foreign Application Priority Data

May 2, 2008 (TW) .............................. 97116216 A

(51) Int. Cl.
*H04N 3/14* (2006.01)
*H01L 31/062* (2006.01)
*H01L 21/00* (2006.01)
(52) U.S. Cl. ........... 348/294; 257/291; 257/292; 438/57
(58) Field of Classification Search .................. 438/57; 257/100, 678, 291–292; 348/294
See application file for complete search history.

(56) References Cited

U.S. PATENT DOCUMENTS

2006/0171698 A1* 8/2006 Ryu et al. ...................... 396/114
2006/0261458 A1* 11/2006 Paek et al. ..................... 257/680

* cited by examiner

*Primary Examiner* — Lin Ye
*Assistant Examiner* — Mekonnen Dagnew
(74) *Attorney, Agent, or Firm* — Rosenberg, Klein & Lee

(57) ABSTRACT

An image-sensing chip package module for reducing its whole thickness can fix an image-sensing unit under a substrate unit via an adhesive body disposed between the substrate unit and the image-sensing unit, so that the image-sensing unit can be firmly fixed under a bottom area (the bottom area is a receiving space formed by using a plurality of first conductive protruding bodies to support the substrate unit up relative to a main PCB) of the substrate unit. In other words, the image-sensing unit is received in the receiving space formed by using the first conductive protruding bodies to support the substrate unit up relative to the main PCB, so that the whole thickness of the image-sensing chip package module can be reduced. Therefore, it is easy for designer to integrate the image-sensing chip package module into any portable electronic devices such as mobile phone or notebook.

14 Claims, 6 Drawing Sheets

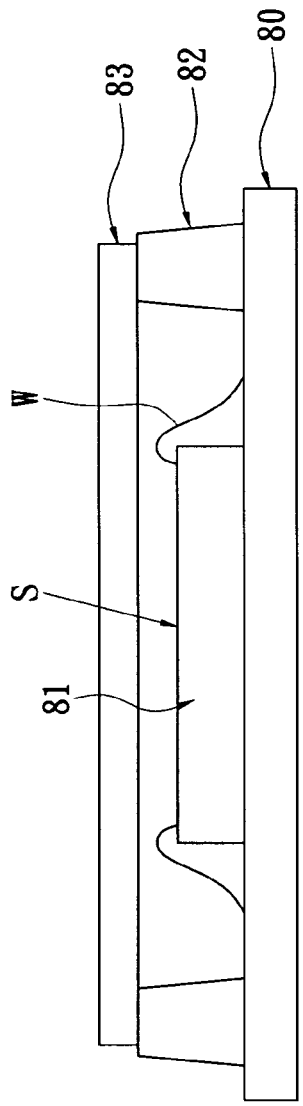
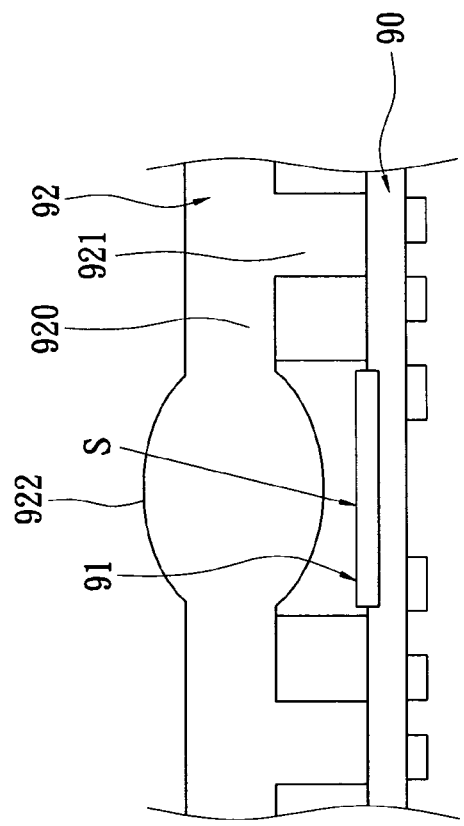
FIG. 1A PRIOR ART
FIG. 1B PRIOR ART

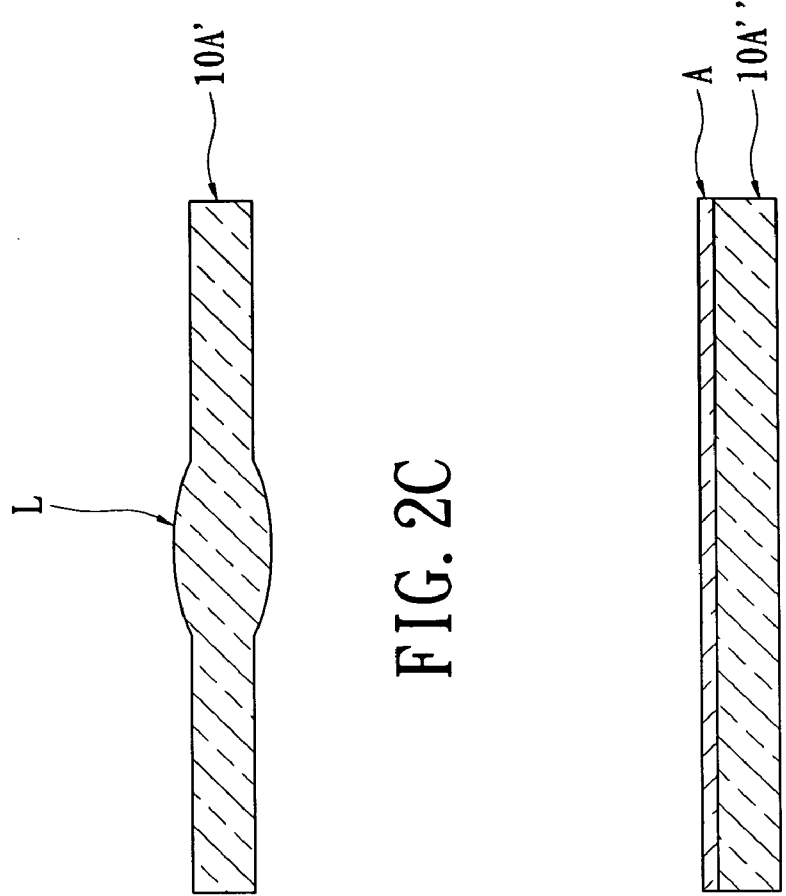
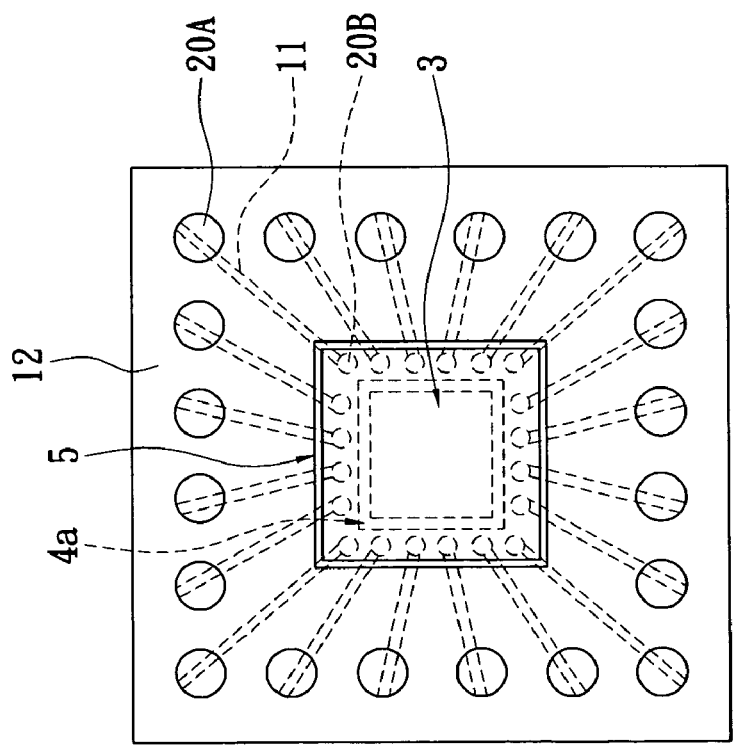

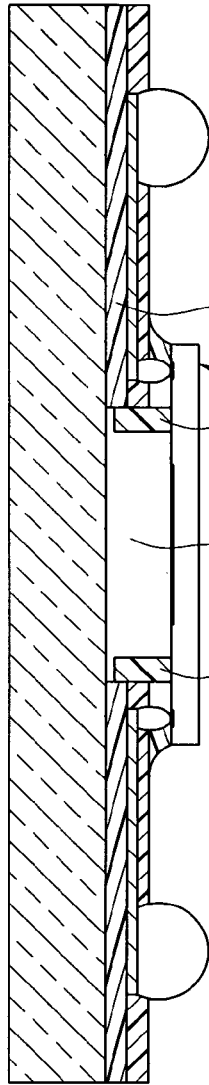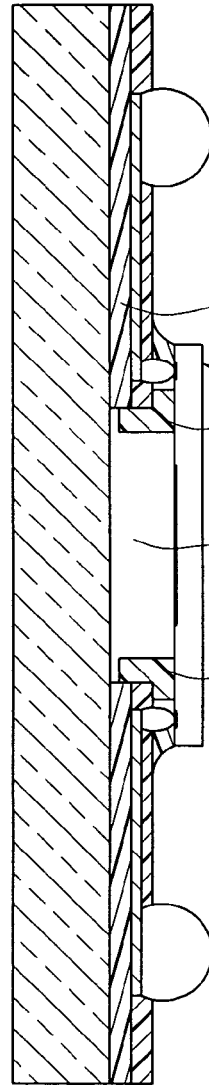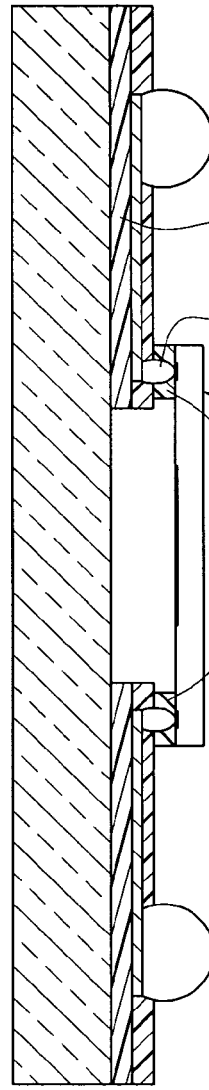

IMAGE-SENSING CHIP PACKAGE MODULE FOR REDUCING ITS WHOLE THICKNESS

BACKGROUND OF THE INVENTION

1. Field of the Invention

The present invention relates to an image-sensing chip package module, and particularly relates to an image-sensing chip package module for reducing its whole thickness.

2. Description of the Related Art

The advantage of CMOS (Complementary Metal-Oxide-Semiconductor) is low power consumption and small size, so that the CMOS image-sensing chip package module can integrate into some special portable electronic device with small size such as mobile phone and notebook.

Referring to FIG. 1A, the prior art provides a first type of an image-sensing chip package module includes: a substrate board 80, a CMOS image-sensing chip 81, a support 82 and a transparent glass 83. The CMOS image-sensing chip 81 is electrically connected to the substrate board 80 via a plurality of lead wires W by a wire-bonding method. The support 82 supports the transparent glass 83 up by a predetermined height. Hence, external light signals S pass through the transparent glass 83 to project onto the CMOS image-sensing chip 81.

Referring to FIG. 1B, the prior art provides a second type of an image-sensing chip package module includes: a substrate board 90, a CMOS image-sensing chip 91 and a transparent glass 92. The CMOS image-sensing chip 91 is electrically disposed on the substrate board 90. The transparent glass 92 has a transparent body 920, a support 921 for supporting the transparent body 920 up by a predetermined height and positioning the transparent body 920 on the substrate board 90, and a light-condensing lens 922 disposed over the CMOS image-sensing chip 91. Hence, external light signals S pass through the light-condensing lens 922 of the transparent glass 92 to project onto the CMOS image-sensing chip 91.

However, the image-sensing chip package module of the prior art has some defects, such as large thickness and complex manufacturing process.

Hence, it is very important for designer to design a CMOS image-sensing chip package module of small thickness in order to integrate into a portable electronic device of small thickness according to different market requirements.

SUMMARY OF THE INVENTION

One particular aspect of the present invention is to provide an image-sensing chip package module for reducing its whole thickness. The image-sensing chip package module has an image-sensing unit received in a receiving space formed by using a plurality of first conductive protruding bodies to support a substrate unit up relative to a main PCB, so that the whole thickness of the image-sensing chip package module can be reduced. Therefore, it is easy for designer to integrate the image-sensing chip package module into any portable electronic devices such as mobile phone or notebook.

In order to achieve the above-mentioned aspects, the present invention provides an image-sensing chip package module for reducing its whole thickness, including: a substrate unit, a conductive protruding unit, an image-sensing unit, and an adhesive unit.

The substrate unit has a substrate body, a plurality of conductive traces formed on a bottom side of the substrate body, and an insulative layer formed on a bottom side of the substrate body for covering the conductive traces. Two opposite end sides of each conductive trace respectively are a first soldering area and a second soldering area, and the first soldering area and the second soldering area are exposed by the insulative layer. The conductive protruding unit has a plurality of first conductive protruding bodies and a plurality of second conductive protruding bodies. Each first conductive protruding body is electrically connected to the first soldering area of each conductive trace, and each second conductive protruding body is electrically connected to the second soldering area of each conductive trace.

Moreover, the image-sensing unit is disposed under the substrate unit, and the image-sensing unit has an image-sensing surface for receiving external light signals through the substrate body and a plurality of conductive pads respectively and electrically connected to the second conductive protruding bodies. The adhesive unit has one or more adhesive bodies disposed between the substrate unit and the image-sensing unit in order to fix the image-sensing unit under the substrate unit.

Hence, the present invention can fix the image-sensing unit under the substrate unit via the adhesive body disposed between the substrate unit and the image-sensing unit, so that the image-sensing unit can be firmly fixed under a bottom area (the bottom area is a receiving space formed by using the first conductive protruding bodies to support the substrate unit up relative to a main PCB) of the substrate unit. In other words, the image-sensing unit is received in the receiving space formed by using the first conductive protruding bodies to support the substrate unit up relative to the main PCB, so that the whole thickness of the image-sensing chip package module can be reduced. Therefore, it is easy for designer to integrate the image-sensing chip package module into any portable electronic devices such as mobile phone or notebook.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 1A is a lateral, schematic view of a first type of an image-sensing chip package module of the prior art;

FIG. 1B is a lateral, schematic view of a second type of an image-sensing chip package module of the prior art;

FIG. 2B is a bottom view of an image-sensing chip package module for reducing its whole thickness according to the first embodiment of the present invention;

FIG. 2C is a lateral, schematic view of a second type of a transparent body according to the first embodiment of the present invention;

FIG. 2D is a lateral, schematic view of a third type of a transparent body according to the first embodiment of the present invention;

FIG. 5 is a lateral, cross-sectional view of an image-sensing chip package module for reducing its whole thickness according to the fourth embodiment of the present invention;

FIG. 6 is a lateral, cross-sectional view of an image-sensing chip package module for reducing its whole thickness according to the fifth embodiment of the present invention;

FIG. 7 is a lateral, cross-sectional view of an image-sensing chip package module for reducing its whole thickness according to the sixth embodiment of the present invention;

DETAILED DESCRIPTION OF THE PREFERRED EMBODIMENTS

Figure 2A:
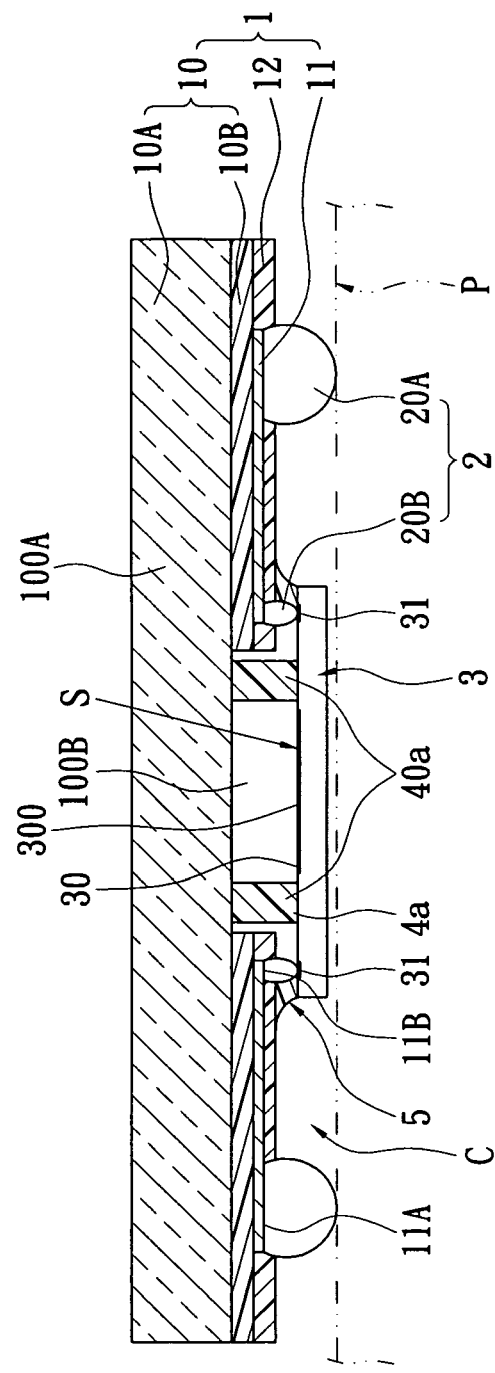
FIG. 2A is a lateral, cross-sectional view of an image-sensing chip package module for reducing its whole thickness according to the first embodiment of the present invention.

Referring to FIGS. 2A and 2B, the first embodiment of the present invention provides an image-sensing chip package module for reducing its whole thickness, including: a substrate unit 1, a conductive protruding unit 2, an image-sensing unit 3, an adhesive unit 4 and an underfill 5.

The substrate unit 1 has a substrate body 10, a plurality of conductive traces 11 formed on a bottom side of the substrate body 10, and an insulative layer 12 formed on a bottom side of the substrate body 10 for covering the conductive traces 11. In the first embodiment, the substrate body 10 is composed of a transparent body 10A and an opaque body 10B disposed on the bottom side of the transparent body 10A. The transparent body 10A can be a transparent glass, and the transparent body 10A has a transparent area 100A. In addition, the conductive traces 11 are formed on the bottom side of the opaque body 10B, the insulative layer 12 is a solder mask formed on the bottom side of the opaque body 10B for covering the conductive traces 11, and the opaque body 10B has an opening 100B.

Moreover, two opposite end sides of each conductive trace 11 respectively are a first soldering area 11A and a second soldering area 11B, and the first soldering area 11A and the second soldering area 11B are exposed by the insulative layer 12. In other words, the insulative layer 12 is formed on the bottom side of the opaque body 10B in order to expose the first soldering area 11A and the second soldering area 11B and cover the conductive traces 11.

Furthermore, the conductive protruding unit 2 has a plurality of first conductive protruding bodies 20A and a plurality of second conductive protruding bodies 20B. Each first conductive protruding body 20A is electrically connected to the first soldering area 11A of each conductive trace 11, and each second conductive protruding body 20B is electrically connected to the second soldering area 11B of each conductive trace 11. The first conductive protruding bodies 20A can be solder balls, and the second conductive protruding bodies 20B can be gold bumps. However, the solder balls and the gold bumps are just an example and do not use to limit the present invention. Hence, the image-sensing chip package module of the present invention can electrically connect with a main PCB (Printed Circuit Board) P via the first conductive protruding bodies 20A.

In addition, the image-sensing unit 3 is disposed under the substrate unit 1, and the image-sensing unit 3 has an image-sensing surface 30 for receiving external light signals S through the substrate body 10 and a plurality of conductive pads 31 respectively and electrically connected to the second conductive protruding bodies 20B. In the first embodiment, the opening 100B of the opaque body 10B is formed over the image-sensing surface 30, the image-sensing surface 30 has an image-sensing area 300, and the transparent area 100A can be larger than the image-sensing area 300 (the transparent area 100A can be the same as the image-sensing area 300 according to different design requirements). Hence, the external light signals S pass through the transparent body 10A and the opening 100B of the opaque body 10B to project onto the image-sensing surface 30 of the image-sensing unit 3. In addition, the image-sensing unit can be any type of image-sensing chip for capturing images according to different design requirements, such as CMOS (Complementary Metal-Oxide-Semiconductor).

Moreover, the adhesive unit 4a has one or more adhesive bodies 40a (as shown in FIG. 2B, there is an adhesive body 40a in the first embodiment) disposed between the substrate unit 1 and the image-sensing unit 3 in order to fix the image-sensing unit 3 under the substrate unit 1. The adhesive body 40a is adhered between the transparent body 10A and the image-sensing unit 3, and the adhesive body 40a is separated from the second conductive protruding bodies 20B by a predetermined distance. In addition, the underfill 5 is formed between the insulative layer 12 and the image-sensing unit 3 in order to surround the second conductive protruding bodies 20B. Hence, the present invention can fix the image-sensing unit 3 under the substrate unit 1 via the adhesive body 40a disposed between the substrate unit 1 and the image-sensing unit 3, so that the image-sensing unit 3 can be firmly fixed under a bottom area (the bottom area is a receiving space C formed by using the first conductive protruding bodies 20A to support the substrate unit 1 up relative to the main PCB P) of the substrate unit 1. In other words, the image-sensing unit 3 is received in the receiving space C formed by using the first conductive protruding bodies 20A to support the substrate unit 1 up relative to the main PCB P, so that the whole thickness of the image-sensing chip package module can be reduced. Therefore, it is easy for designer to integrate the image-sensing chip package module into any portable electronic devices such as mobile phone or notebook.

Referring to FIG. 2C, another type the transparent body 10A' has a light-condensing lens L.

Referring to FIG. 2D, another type the transparent body 10A" has an anti-infrared layer A formed on its top surface.

Figure 3:
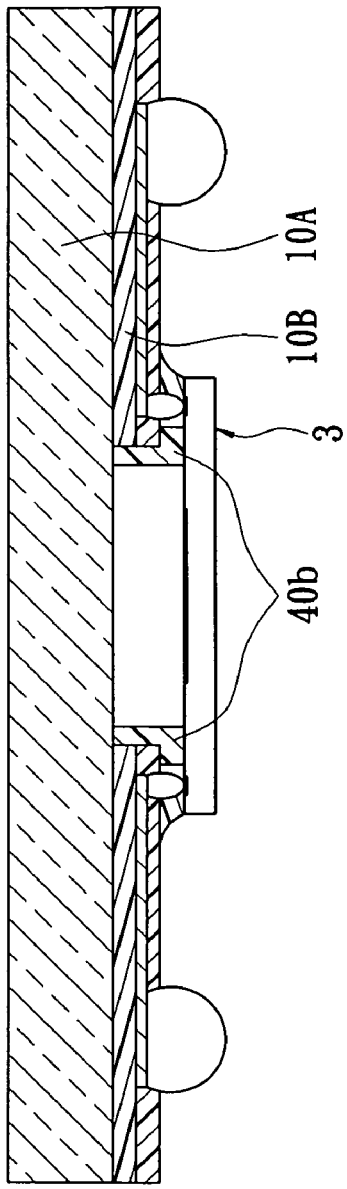
FIG. 3 is a lateral, cross-sectional view of an image-sensing chip package module for reducing its whole thickness according to the second embodiment of the present invention.

Referring to FIG. 3, the difference between the second embodiment and the first embodiment is that: in the second embodiment, an adhesive body 40b is adhered between the transparent body 10A, the opaque body 10B and the image-sensing unit 3.

Figure 4:
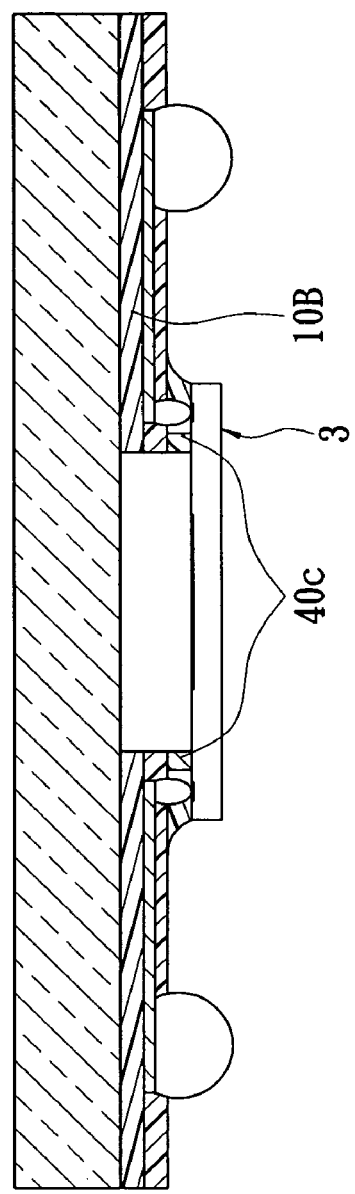
FIG. 4 is a lateral, cross-sectional view of an image-sensing chip package module for reducing its whole thickness according to the third embodiment of the present invention.

Referring to FIG. 4, the difference between the third embodiment and above-mentioned embodiments is that: in the third embodiment, an adhesive body 40c is adhered between the opaque body 10B and the image-sensing unit 3, and especially the adhesive body 40c is adhered between the bottom side of the opaque body 10B and the image-sensing unit 3.

Referring to FIG. 5, the difference between the fourth embodiment and above-mentioned embodiments is that: in the fourth embodiment, an adhesive body 40d is adhered between the opaque body 10B and the image-sensing unit 3, and especially the adhesive body 40d is adhered between an inner surface of the opening 100B of the opaque body 10B and the image-sensing unit 3.

Referring to FIG. 6, the difference between the fifth embodiment and above-mentioned embodiments is that: in the fifth embodiment, an adhesive body 40e is adhered between the opaque body 10B and the image-sensing unit 3, and especially the adhesive body 40e is adhered between an inner surface of the opening 100B of the opaque body 10B, the bottom side of the opaque body 10B and the image-sensing unit 3.

Referring to FIG. 7, the difference between the sixth embodiment and above-mentioned embodiments is that: in the sixth embodiment, an adhesive body 40f is adhered between the bottom side of the opaque body 10B and the image-sensing unit 3 in order to cover the second conductive protruding bodies 20B, and the adhesive body 40f is an ACF (Anisotropic Conductive Film) with a unilateral conduction function and an adhesive function. Hence, the sixth embodiment lacks the underfill 5.

Figure 8:
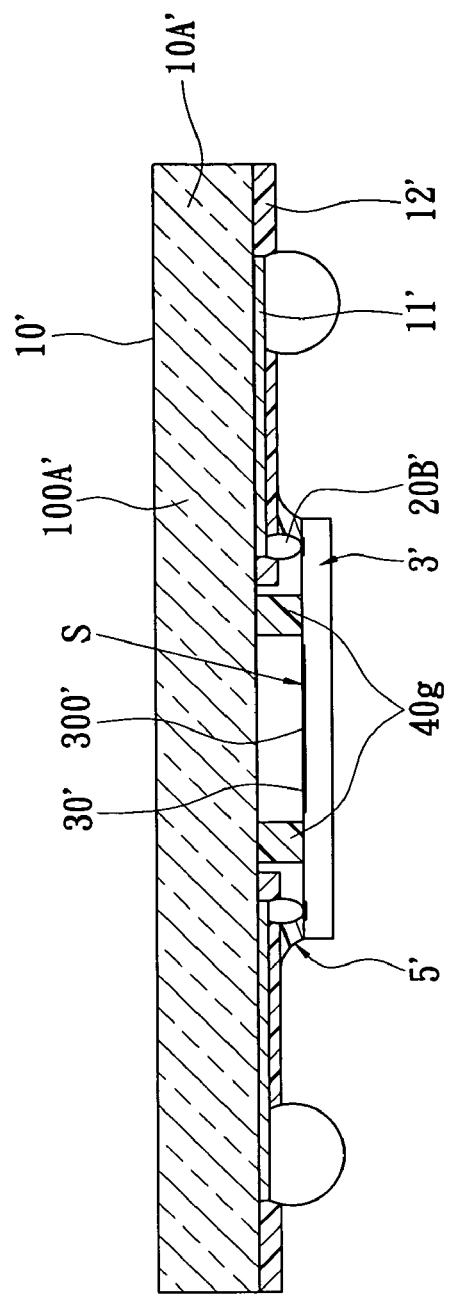
FIG. 8 is a lateral, cross-sectional view of an image-sensing chip package module for reducing its whole thickness according to the seventh embodiment of the present invention.

Referring to FIG. 8, the difference between the seventh embodiment and above-mentioned embodiments is that: in the seventh embodiment, a substrate body 10' is a transparent body 10A', a plurality of conductive traces 11' are formed on the bottom side of the transparent body 10A', and an insulative layer 12' is a solder mask formed on the bottom side of the transparent body 10A' for covering the conductive traces 11', so that the external light signals S pass through the transparent body 10A' to project onto an image-sensing surface 30' of an image-sensing unit 3'.

Furthermore, an underfill 5' is formed between the insulative layer 12' and the image-sensing unit 3' in order to surround a plurality of second conductive protruding bodies 20B'. In addition, an adhesive body 40g is adhered between the transparent body 10A' and the image-sensing unit 3', and the adhesive body 40g is separated from the second conductive protruding bodies 20B' by a predetermined distance.

Moreover, the same as above-mentioned embodiments is that: in the seventh embodiment, the transparent body 10A' can be a glass or a glass with a light-condensing lens and/or an anti-infrared layer. In addition, the transparent body 10A' has a transparent area 100A', the image-sensing surface 30' has an image-sensing area 300', and the transparent area 100A' is larger than the image-sensing area 300'.

Figure 9:
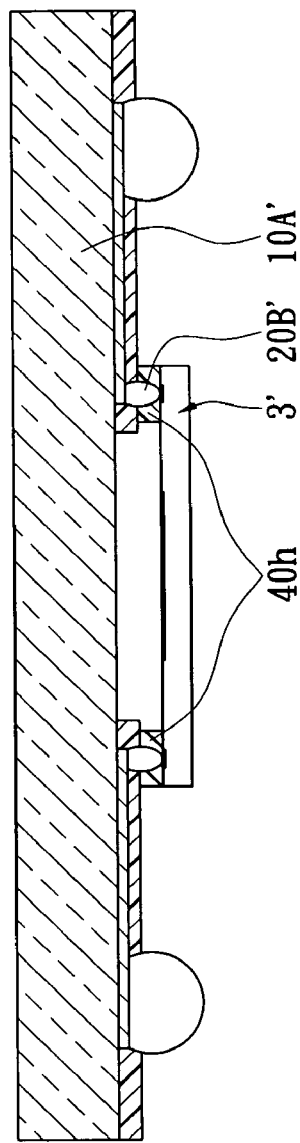
FIG. 9 is a lateral, cross-sectional view of an image-sensing chip package module for reducing its whole thickness according to the eighth embodiment of the present invention.

Referring to FIG. 9, the difference between the eighth embodiment and the seventh embodiment is that: in the eighth embodiment, an adhesive body 40h is adhered between the bottom side of the transparent body 10A' and the image-sensing unit 3' in order to cover the second conductive protruding bodies 20B', and the adhesive body 40h is an ACF (Anisotropic Conductive Film) with a unilateral conduction function and an adhesive function. Hence, the eighth embodiment lacks the underfill 5.

In conclusion, the present invention can fix the image-sensing unit under the substrate unit via the adhesive body disposed between the substrate unit and the image-sensing unit, so that the image-sensing unit can be firmly fixed under a bottom area (the bottom area is a receiving space formed by using the first conductive protruding bodies to support the substrate unit up relative to the main PCB) of the substrate unit. In other words, the image-sensing unit is received in the receiving space formed by using the first conductive protruding bodies to support the substrate unit up relative to the main PCB, so that the whole thickness of the image-sensing chip package module can be reduced. Therefore, it is easy for designer to integrate the image-sensing chip package module into any portable electronic devices such as mobile phone or notebook.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An image-sensing chip package module electrically connected to a main PCB, comprising:
    a substrate unit including a transparent body, an opaque body disposed on one part of the bottom surface of the transparent body, a plurality of conductive traces formed on the bottom side of the opaque body, and an insulative layer formed on the bottom side of the opaque body to partially cover each conductive trace, wherein the opaque body has an opening to expose the other part of the bottom surface of the transparent body, each conductive trace has a first soldering area and a second soldering area respectively formed on two opposite ends thereof, and the first soldering area and the second soldering area of each conductive trace are exposed from the insulative layer;
    a conductive protruding unit including a plurality of first conductive protruding bodies respectively and electrically contacting the first soldering areas of the conductive traces and a plurality of second conductive protruding bodies respectively and electrically contacting the second soldering areas of the conductive traces, wherein each first conductive protruding body and each second conductive protruding body are disposed between the substrate unit and the main PCB, thus the substrate unit is supported by the conductive protruding unit to form a receiving space between the substrate unit and the main PCB;
    an image-sensing unit received in the receiving space and surrounded by the first conductive protruding bodies, wherein the image-sensing unit is separated from and adjacent to the main PCB, and the image-sensing unit has an image-sensing surface facing the opening of the opaque body and a plurality of conductive pads formed on the top surface thereof to respectively and electrically contact the second conductive protruding bodies; and
    an adhesive unit including a plurality of adhesive bodies disposed between the substrate unit and the image-sensing unit to fix the image-sensing unit between the substrate unit and the main PCB.

2. The image-sensing chip package module as claimed in claim 1, wherein the image-sensing unit is a CMOS (Complementary Metal-Oxide-Semiconductor).

3. The image-sensing chip package module as claimed in claim 1, wherein the transparent body is a transparent glass.

4. The image-sensing chip package module as claimed in claim 1, wherein the transparent body has a light-condensing lens.

5. The image-sensing chip package module as claimed in claim 1, wherein the transparent body has an anti-infrared layer formed on its top surface.

6. The image-sensing chip package module as claimed in claim 1, wherein the transparent body has a transparent area, the image-sensing surface has an image-sensing area, and the transparent area is larger than the image-sensing area.

7. The image-sensing chip package module as claimed in claim 1, wherein the adhesive body is adhered between the bottom side of the opaque body and the image-sensing unit in order to cover the second conductive protruding bodies, and the adhesive body is an ACF (Anisotropic Conductive Film) with a unilateral conduction function and an adhesive function.

8. The image-sensing chip package module as claimed in claim 1, further comprising: an underfill formed between the insulative layer and the image-sensing unit in order to surround the second conductive protruding bodies.

9. The image-sensing chip package module as claimed in claim 8, wherein the adhesive body is adhered between the transparent body and the image-sensing unit, and the adhesive body is separated from the second conductive protruding bodies by a predetermined distance.

10. The image-sensing chip package module as claimed in claim 8, wherein the adhesive body is adhered between the transparent body, the opaque body and the image-sensing unit, and the adhesive body is separated from the second conductive protruding bodies by a predetermined distance.

11. The image-sensing chip package module as claimed in claim 8, wherein the adhesive body is adhered between the opaque body and the image-sensing unit, and the adhesive body is separated from the second conductive protruding bodies by a predetermined distance.

12. The image-sensing chip package module as claimed in claim 11, wherein the adhesive body is adhered between the bottom side of the opaque body and the image-sensing unit.

13. The image-sensing chip package module as claimed in claim 11, wherein the adhesive body is adhered between an inner surface of the opening of the opaque body and the image-sensing unit.

14. The image-sensing chip package module as claimed in claim 11, wherein the adhesive body is adhered between an inner surface of the opening of the opaque body, the bottom side of the opaque body and the image-sensing unit.

* * * * *